US012484216B2

(12) United States Patent
Liang et al.

(10) Patent No.: US 12,484,216 B2
(45) Date of Patent: Nov. 25, 2025

(54) METHOD FOR MANUFACTURING A SUPER FLASH MEMORY

(71) Applicant: Shanghai Huali Integrated Circuit Corporation, Shanghai (CN)

(72) Inventors: Qichao Liang, Shanghai (CN); Zhi Tian, Shanghai (CN); Feng Ji, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 567 days.

(21) Appl. No.: 17/965,116

(22) Filed: Oct. 13, 2022

(65) Prior Publication Data

US 2023/0157012 A1 May 18, 2023

(30) Foreign Application Priority Data

Nov. 16, 2021 (CN) .......................... 202111351581.X (51) Int. Cl.
*H10B 41/00* (2023.01)
*H01L 21/02* (2006.01)
*H01L 21/304* (2006.01)
*H01L 21/324* (2006.01)
*H01L 21/768* (2006.01)

(52) U.S. Cl.
CPC ....... *H10B 41/00* (2023.02); *H01L 21/02186* (2013.01); *H01L 21/3043* (2013.01); *H01L 21/324* (2013.01); *H01L 21/76877* (2013.01)

(58) Field of Classification Search
CPC ............... H10B 41/00; H10D 30/0411; H10D 30/6892; H10D 30/6891
See application file for complete search history.

(56) References Cited

U.S. PATENT DOCUMENTS

| | | | | |
|---|---|---|---|---|
| 2004/0132251 A1* | 7/2004 | Yoshino | ............. | H01L 21/2652 257/E21.337 |
| 2008/0029781 A1* | 2/2008 | Nguyen | ............. | H10D 30/0221 257/E27.098 |
| 2009/0142891 A1* | 6/2009 | Kim | ................. | H10D 84/0167 257/E21.632 |
| 2019/0392899 A1* | 12/2019 | Daryanani | ......... | G11C 11/4074 |

FOREIGN PATENT DOCUMENTS

CN 102169854 A * 8/2011
CN 209785940 U * 12/2019

* cited by examiner

*Primary Examiner* — William B Partridge
*Assistant Examiner* — Felix B Andrews
(74) *Attorney, Agent, or Firm* — Banner & Witcoff, Ltd.

(57) ABSTRACT

The present application discloses a method for manufacturing a semiconductor device, which includes the following steps: step 1: forming first gate structures on a semiconductor substrate; step 2: performing a first etching process to etch the semiconductor substrate on at least one side of each first gate structure to a certain depth and form a first groove; step 3: performing a stress memorization process, including step 31: forming a stress dielectric layer, the stress dielectric layer covering a peripheral surface of each first gate structure and being filled in the first groove; step 32: performing annealing to transfer the stress of the stress dielectric layer to a channel region; step 33: removing the stress dielectric layer. The present application can increase the effect of transferring the stress of the stress dielectric layer to the channel region, thereby increasing the mobility of channel carriers.

12 Claims, 6 Drawing Sheets

METHOD FOR MANUFACTURING A SUPER FLASH MEMORY

CROSS-REFERENCE TO RELATED APPLICATIONS

This application claims the priority to Chinese Patent Application No. 202111351581.X, filed on Nov. 16, 2021, the disclosure of which is incorporated herein by reference in entirety.

TECHNICAL FIELD

The present application relates to a method for manufacturing a semiconductor integrated circuit, in particular to a method for manufacturing a semiconductor device.

BACKGROUND

In the semiconductor integration process, a complete chip often includes millions of electronic devices. With the development of the process and the increase of application requirements, integrated circuits are developing towards micro refinement, multi-layering, planarization and thinning. In very large-scale integrated circuits, millions of transistors are designed on only silicon with a size of few millimeters. Moreover, with the further improvement of function and speed, the size of the device is further reduced and the integration level is further improved.

In the 38 Super Flash (SF) memory, due to its special structure and operating characteristics, it shows advantages over traditional memories, such as large storage capacity, small leakage and high integration level. However, in the actual test process, the programming and reading speed of 38SF memory cell is slow. In addition to process optimization, increasing the channel carrier mobility is also an effective method. Therefore, improving the channel carrier mobility of the flash memory cell while optimizing the process can make the reading and writing ability of the cell stronger.

Figure 1:
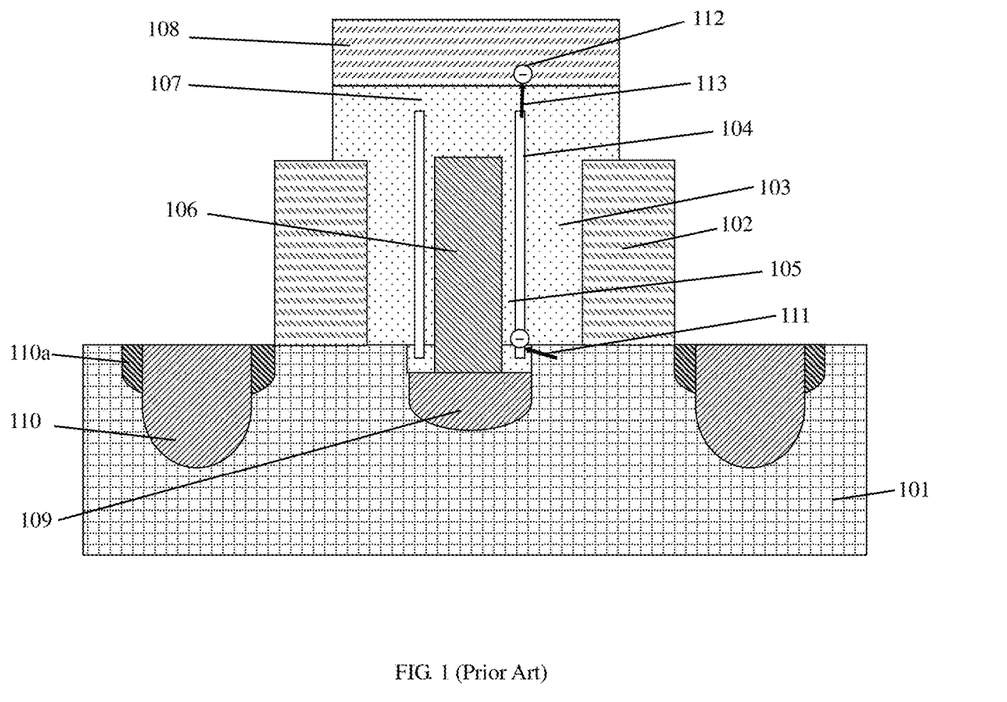
FIG. 1 illustrates a schematic diagram of a structure of an existing 38 super flash memory.

Referring to FIG. 1, it illustrates a schematic diagram of a structure of an existing 38SF. The existing 38SF includes the following components:

A word line gate formed by superposing a first gate dielectric layer (not shown) and a Word Line (WL) polysilicon gate 102 is formed on a semiconductor substrate 101.

A Floating Gate (FG) 104 consists of a TiN layer. The floating gate 104 and the word line polysilicon gate 102 are isolated by an inter-gate dielectric layer 103.

A Source Line (SL) 106 is formed above the source region 109. The source line 106 is simultaneously used as a Control Gate (CG).

The source line 106 and the floating gate 104 are isolated by an inter-gate dielectric layer 105.

An erase gate (EG) 108 covers tops of the source line 106 and the floating gate 104. The erase gate 108 and the source line 106 and the floating gate 104 at the bottom are isolated by an inter-gate dielectric layer 107.

A lightly doped drain region 110A and a drain region 110 are further formed through self-alignment in the semiconductor substrate 101 on a side surface of the word line polysilicon gate 102.

Generally, the flash memory cell is an N-type device, and the source region 109 and the drain region 110 are N-type heavily doped. A P-well is usually formed on the semiconductor substrate 101. A channel region between the source region 109 and the drain region 110 is divided into two sections. The first section of the channel region consists of a P-well in a region covered by the word line polysilicon gate 102, and the second section of the channel region consists of a P-well from a side surface of the word line polysilicon gate 102 close to the source region 109 to the source region 109. The first section of the channel region is controlled by applying voltage to the word line polysilicon gate 102. The second section of the channel region is controlled by the charge stored in the floating gate 104. When the electrons indicated by reference sign 112 are stored in the floating gate 104, the second section of the channel region will be off; when the electrons indicated by reference sign 112 are not stored in the floating gate 104, the second section of the channel region will be on.

38SF uses the writing operation of the horizontal electric field, namely the programming operation, and the tip TiN voltage coupling-free erasing operation, thus greatly improving the erasing efficiency and reducing the operating voltage. This structure increases the nesting window of EG to FG and realizes better tip control, and the endurance performance is better. Referring to FIG. 1, during the writing operation, the source line 106 will act as a control gate. After applying voltage to the source line 106, a transverse electric field will be generated, so that electrons indicated by reference sign 112 will be implanted into the floating gate 104 along the arrow line indicated by reference sign 111. During the erasing operation, electrons indicated by reference sign 112 are implanted into the erase gate 108 along the arrow line indicated by reference sign 113.

As can be seen from FIG. 1, the bottom surface of the floating gate 104 will be located below the top surface of the semiconductor substrate 101, so the semiconductor substrate 101 needs to be subjected to an etching process during Source Contact (SC) etching, thus forming, a groove in the surface of the semiconductor substrate 101. Therefore, the bottom surface of the source contact opening formed through source contact etching will be located below the top surface of the semiconductor substrate 101. In this way, when the floating gate 104 and the source line 106 are formed in the source contact opening, the bottom surface of the floating gate 104 can be arranged below the top surface of the semiconductor substrate 101.

The function test of the flash memory cell shows that the current read in the programming process of the existing flash memory cell is small and the reading speed is slow, which is caused by that the number of electrons stored in the floating gate 104 is small. The number of electrons stored in the floating gate 104 is small mainly because the thickness and uniformity of the floating gate 104 need to be further optimized, the maintaining time of the transverse electric field in the programming process is short, and the migration rate of electrons cannot be further accelerated in a short time, resulting in less electrons entering the floating gate 104.

BRIEF SUMMARY

The present application provides a method for manufacturing a semiconductor device, which can increase the stress in the channel region, thereby increasing the mobility of channel carriers. The process is simple, which can be easily added to the manufacturing process of the super flash memory and effectively improve the reading and writing performance of the flash memory cell.

According to some embodiments in this application, a method for manufacturing the semiconductor device is disclosed in the following steps:

step 1: providing a semiconductor substrate, forming first gate structures on the semiconductor substrate, and forming a channel region in the semiconductor substrate covered by the first gate structures;

step 2: performing a first etching process to etch the semiconductor substrate on at least one side of each first gate structure to a certain depth and form a first groove;

step 3: performing a stress memorization process, including the following sub-steps:

step 31: forming a stress dielectric layer, the stress dielectric layer covering a peripheral surface of each first gate structure and being filled in the first groove;

step 32: performing annealing to transfer the stress of the stress dielectric layer to the channel region, the stress in the channel region after stress transfer being increased in the process of stress transfer by using the characteristic that the stress dielectric layer located in the first groove laterally acts on the channel region;

step 33: removing the stress dielectric layer.

In some cases, the semiconductor substrate includes a silicon substrate.

In some cases, each first gate structure includes a first gate dielectric layer and a first polysilicon gate superposed sequentially.

In some cases, in step 2, two sides of each first gate structure are respectively a source region side and a drain region side; the first groove is located in the source region side of the first gate structure; or the first groove is located in the source region side and the drain region side of the first gate structure.

In some cases, in step 31, the stress dielectric layer has tensile stress, the semiconductor device is an N-type device, and the channel region is a P-type doped region.

In some cases, the stress dielectric layer is a first silicon nitride layer with tensile stress.

In some cases, before forming the stress dielectric layer, the method for manufacturing the semiconductor device further includes a step of forming a stress blocking layer, and in the first groove, the stress blocking layer is located between the stress dielectric layer and the semiconductor substrate to prevent stress damage caused by the stress dielectric layer to the semiconductor substrate.

In some cases, the material of the stress blocking layer includes silicon dioxide.

In some cases, in step 1, each first gate structure is a word line gate of a flash memory cell of a super flash memory;

in step 2, the first groove is located in the source region side of the first gate structure, the first etching process is an over-etching process of a source contact etching process, the source contact etching process firstly etches the first dielectric layer between adjacent first gate structures to form a source contact opening and then over-etches the semiconductor substrate at a bottom of the source contact opening to form the first groove, and the first groove is used as a part of the source contact opening.

In some cases, the depth of the first groove is 200 Å.

In some cases, after step 3, the method for manufacturing the semiconductor device further includes the following steps:

forming a source region in the semiconductor substrate at a bottom of the first groove;

forming a floating gate and a source line in the source contact opening, wherein in a transverse direction, the floating gate is located between the first gate structure and the source line;

the floating gate and a side surface of the source region side of the first gate structure are isolated by a first inter-gate dielectric layer, and the first inter-gate dielectric layer includes the first dielectric layer;

the floating gate and the source line are isolated by a second inter-gate dielectric layer;

a bottom of the source line is in direct contact with the source region;

a bottom section of the floating gate is located in the first groove, and the bottom surface of the floating gate and the semiconductor substrate are isolated by a floating gate dielectric layer; during writing, the source line is simultaneously used as a control gate, and under the control of the control gate, electrons in the channel region are implanted into the bottom section of the floating gate under the effect of a transverse electric field;

a top surface of the floating gate is higher than a top surface of the source line.

In some cases, the method for manufacturing the semiconductor device further includes the following steps:

forming an erase gate;

the erase gate covers tops of the floating gate and the source line, and the erase gate and the floating gate and the source line at the bottom are isolated by a third inter-gate dielectric layer.

In some cases, the floating gate consists of a TiN layer.

In some cases, the annealing in step 32 is rapid thermal annealing.

In some cases, in step 33, the stress dielectric layer is removed through chemical-mechanical polishing, dry etching or wet etching.

In the existing Stress Memorization Technique (SMT), a stress dielectric layer, such as silicon nitride with tensile stress, is formed directly after the formation of a gate structure. The stress in the stress dielectric layer is transferred to a channel region covered by the gate structure through annealing by using the characteristic that the stress dielectric layer covers the gate structure. The stress can act on the channel region only through the gate structure in the transfer process, and its actual effect will be greatly reduced. On the basis of the existing SMT, after the formation of the first gate structure, the semiconductor substrate on at least one side of the first gate structure is further etched and a first groove is formed, so that the stress dielectric layer will not only cover the first gate structure, but also is formed in the first groove. During annealing for stress transfer, the stress dielectric layer located in the first groove will have a direct lateral effect on the channel region. This effect is better than the effect of the stress dielectric layer coated on the peripheral side of the first gate structure on the channel region. Therefore, the present application can finally increase the stress in the channel region and thus increase the mobility of channel carriers, and finally improve the performance of the device.

In addition, the present application can be implemented by combining the etching of the semiconductor substrate on the side of the gate structure and the SMT process, and has the characteristic of simple process. Therefore, the present application can be easily added to the manufacturing process of the super flash memory and effectively improve the reading and writing operation performance of the flash memory cell. Since the semiconductor substrate is often etched in the existing source contact etching process of the super flash memory, the technical effect of increasing the stress in the channel region can be achieved by adding the SMT process after the source contact etching process is completed. Therefore, the present application can be implemented by only specially setting the time of the SMT process. Compared with the existing method in which the SMT process is performed after the formation of the gate structure, the SMT process is performed after the source contact etching process in the present application. Therefore, the present application can significantly increase the stress in the channel region of the flash memory cell of the super flash memory without adding additional process and time cost, thus improving the reading-writing performance of the flash memory cell.

BRIEF DESCRIPTION OF THE DRAWINGS

The present application will be described below in detail in combination with the embodiments with reference to the drawings.

DETAILED DESCRIPTION

Figure 2:
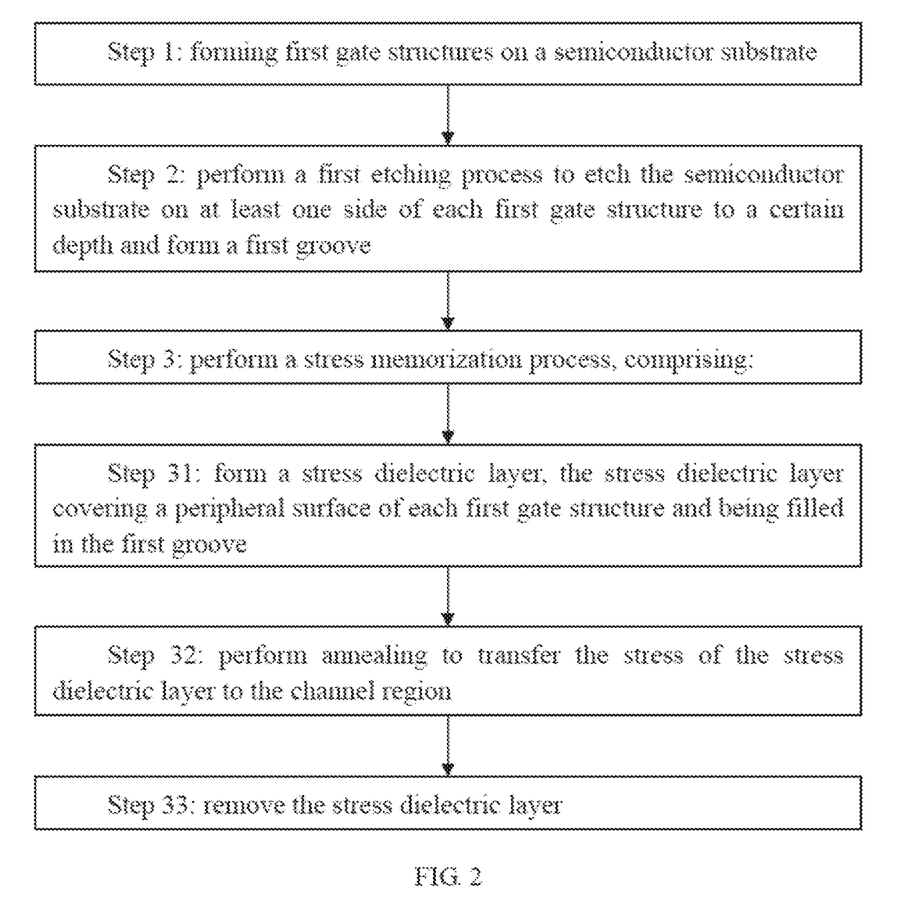
FIG. 2 illustrates a flowchart of a method for manufacturing a semiconductor device according to an embodiment of the present application.
Figure 3A:
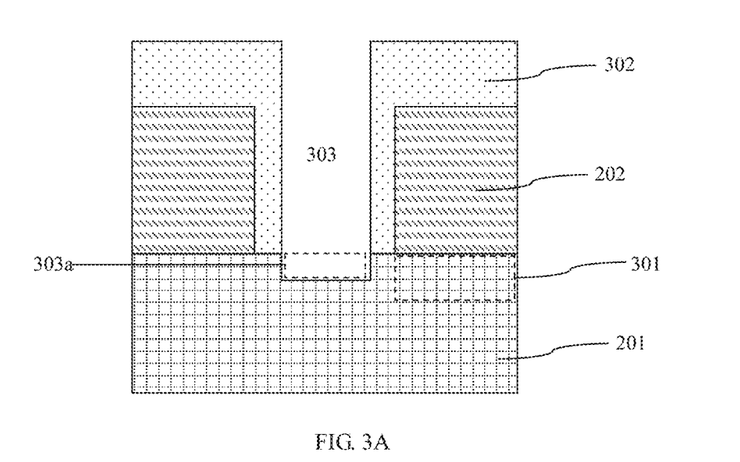
FIG. 3A to FIG. 3F illustrate schematic diagrams of structures of devices in each step of a method for manufacturing a semiconductor device according to an embodiment of the present application.
Figure 3B:
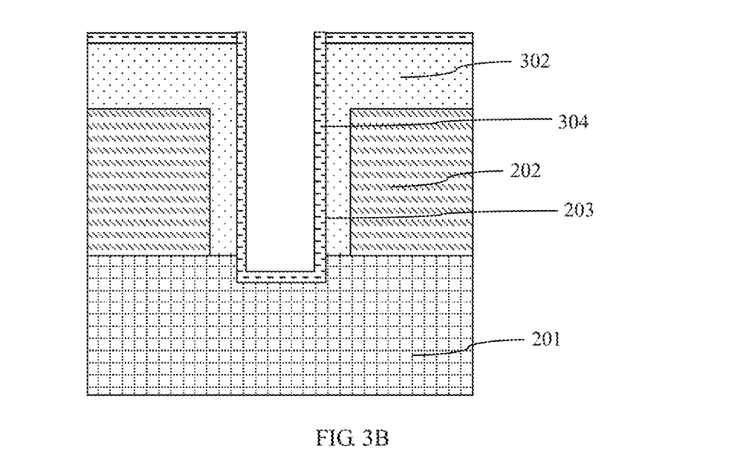

Referring to FIG. 2, it illustrates a flowchart of a method for manufacturing a semiconductor device according to an embodiment of the present application. Referring to FIG. 3A to FIG. 3F, they illustrate schematic diagrams of structures of devices in each step of a method for manufacturing a semiconductor device according to an embodiment of the present application. The method for manufacturing the semiconductor device according to the embodiment of the present application includes the following steps:

In step 1, referring to FIG. 3A, a semiconductor substrate 201 is provided, first gate structures 202 are formed on the semiconductor substrate 201, and a channel region is formed in the semiconductor substrate 201 covered by the first gate structures 202.

In the method according to the embodiment of the present application, the semiconductor substrate 201 includes a silicon substrate.

Each first gate structure 202 includes a first gate dielectric layer and a first polysilicon gate superposed sequentially.

The formation area of the channel region is as illustrated by a dotted box 301.

In step 2, referring to FIG. 3A, a first etching process is performed to etch the semiconductor substrate 201 on at least one side of each first gate structure 202 to a certain depth and form a first groove 303a.

In FIG. 3A, two adjacent first gate structures 202 are illustrated. An area between the two first gate structures 202 is an area shared by the two first gate structures 202, such as the shaped formation area on the source region side. In other embodiments, a first groove 303a may also be formed in the formation area on the drain region side of the first gate structure 202.

In the embodiment of the present application, before the first etching process, the method further includes a step of forming a first dielectric layer 302. The material of the first dielectric layer 302 may be an oxide layer. The first etching process will form an opening 303 in the first dielectric layer 302. The first groove 303a is a part of the opening 303, that is, a bottom part.

Figure 3C:
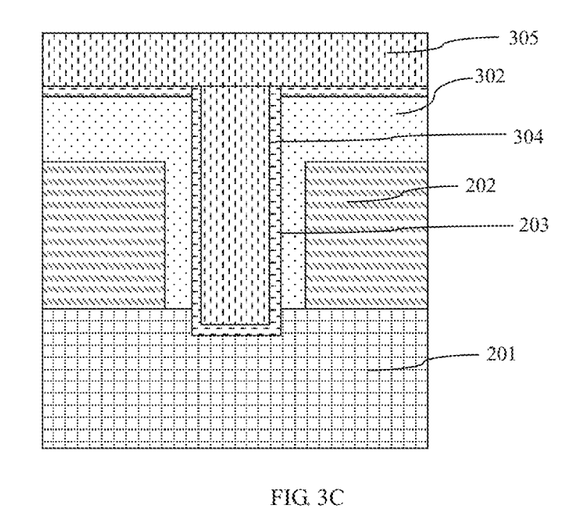

In step 3, a stress memorization process is performed, which includes the following sub-steps:

In step 31, referring to FIG. 3C, a stress dielectric layer 305 is formed. The stress dielectric layer 305 covers a peripheral surface of each first gate structure 202 and is filled in the first groove 303a.

In the embodiment of the present application, the stress dielectric layer 305 in step 31 has tensile stress, the semiconductor device is an N-type device, and the channel region is a P-type doped region. In some embodiments, the stress dielectric layer 305 is a first silicon nitride layer with tensile stress.

Returning to FIG. 3B, before forming the stress dielectric layer 305, the method further includes a step of forming a stress blocking layer 304. In the first groove 303a, the stress blocking layer 304 is located between the stress dielectric layer 305 and the semiconductor substrate 201 to prevent stress damage caused by the stress dielectric layer 305 to the semiconductor substrate 201. In some embodiments, the material of the stress blocking layer 304 is silicon dioxide.

Figure 3D:
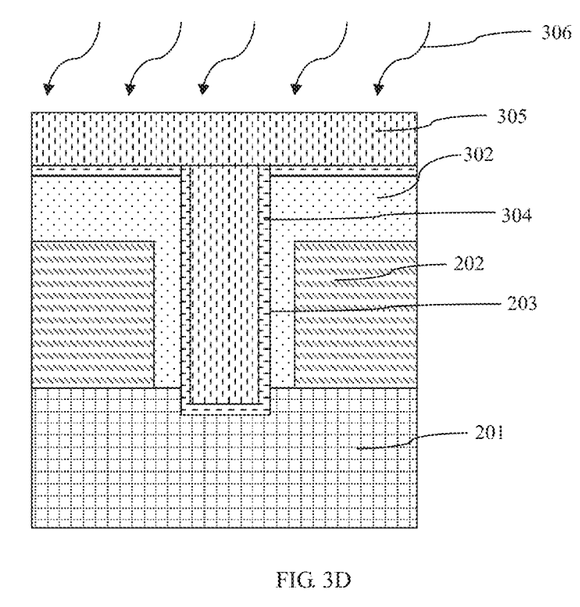

In step 32, referring to FIG. 3D, annealing is performed to transfer the stress of the stress dielectric layer 305 to the channel region. The stress in the channel region after stress transfer is increased in the process of stress transfer by using the characteristic that the stress dielectric layer 305 located in the first groove 303a laterally acts on the channel region. In FIG. 3D, the annealing process is represented by a reference sign 306.

In the embodiment of the present application, the annealing is rapid thermal annealing.

It can be seen from FIG. 3D that the effect of the stress dielectric layer 305 located in the first groove 303a on the channel region is obviously higher than that of the stress dielectric layer 305 above the first groove 303a on the channel region. Therefore, the embodiment of the present application can increase the stress transfer effect on the channel region by adding the first groove 303a, thus increasing the stress in the channel region.

In step 33, the stress dielectric layer 305 is removed.

Figure 3E:
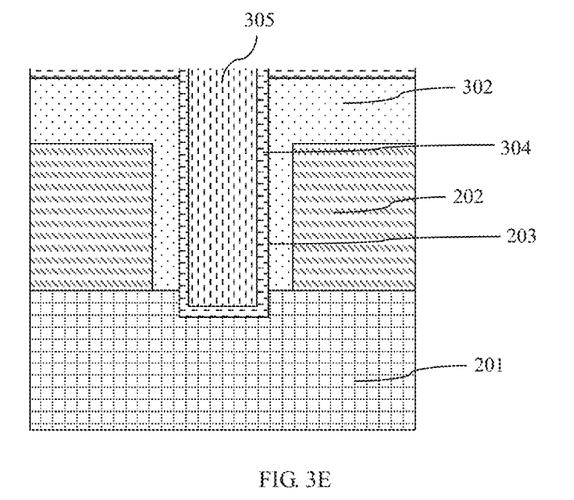

In the embodiment of the present application, the stress dielectric layer 305 is removed by chemical-mechanical polishing, dry etching or wet etching, that is, the stress dielectric layer 305 can be removed by combining chemical-mechanical polishing, dry etching and wet etching processes. For example:

First, referring to FIG. 3E, the stress dielectric layer 305 on the surface of the stress blocking layer 304 outside the opening 303 is removed by using the chemical-mechanical polishing process by directly using the stress blocking layer 304 as a stop layer. The stress dielectric layer 305 on the surface of the stress blocking layer 304 outside the opening 303 may also be removed by combining dry etching and chemical-mechanical polishing.

Figure 3F:
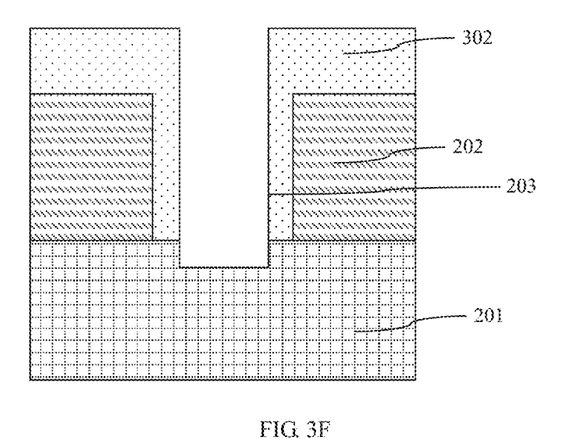

Secondly, referring to FIG. 3F, the stress dielectric layer 305 is removed through a wet etching process; Since the stress dielectric layer 305 is a first silicon nitride layer, the etching solution for wet etching that can remove the stress dielectric layer 305 is hot phosphoric acid.

Then, the stress blocking layer 304 is removed through wet etching. In this way, the structure of the device returns to the structure illustrated in FIG. 3A, but the stress in the channel region in the structure illustrated in FIG. 3F is changed.

In the existing Stress Memorization Technique (SMT), the stress dielectric layer 305, such as silicon nitride with tensile stress, is directly formed after the formation of the gate structure. Using the characteristic that the stress dielectric layer 305 covers the gate structure, the stress in the stress dielectric layer 305 is transferred to the channel region covered by the gate structure through annealing. Based on the existing SMT, in the embodiment of the present application, the semiconductor substrate 201 on at least one side of the first gate structure 202 is further etched after the formation of the first gate structure 202 to form a first groove 303a, so that the stress dielectric layer 305 will not only cover the first gate structure 202, but also is formed in the first groove 303a. During annealing for stress transfer, the stress dielectric layer 305 located in the first groove 303a will have a lateral direct effect on the channel region, which is better than the effect of the stress dielectric layer 305 covering the peripheral side of the first gate structure 202 on the channel region. Therefore, the present application can finally increase the stress in the channel region, thus increasing the mobility of channel carriers and finally improving the performance of the device.

In addition, the present application can be implemented by combining the etching and SMT process of the semiconductor substrate 201 on the side of the gate structure, and has the characteristic of simple process. Therefore, the embodiment of the present application can be easily added to the manufacturing process of the super flash memory and effectively improve the reading and writing operation performance of the flash memory cell.

The method for manufacturing the semiconductor device according to the preferred embodiment of the present application will be described below with reference to FIGS. 3A-3F, 4A and 4B. The method for manufacturing the semiconductor device according to the preferred embodiment of the present application is formed by applying the method according to the embodiment of the present application corresponding to FIG. 3A-3F to a method for manufacturing super flash memory. The method for manufacturing the semiconductor device according to the preferred embodiment of the present application includes the following steps:

Firstly, step 1 to step 3 corresponding to FIG. 3A to FIG. 3F are completed.

In step 1, the first gate structure 202 is a word line gate of a flash memory cell of a super flash memory.

In step 2, the first groove 303a is located on a source region side of the first gate structure 202, the opening 303 is a source contact opening, and the first etching process is an over-etching process of a source contact etching process. The source contact etching process firstly etches the first dielectric layer 302 between the adjacent first gate structures 202 to form a source contact opening, and then etches the semiconductor substrate 201 at a bottom of the source contact opening to form the first groove 303a which is a part of the source contact opening.

In some embodiments, the depth of the first groove 303a is 200 Å.

In step 31, the thickness of the stress blocking layer 304 is 50 Å.

The thickness of the stress dielectric layer 305 is 650 Å.

Figure 4A:
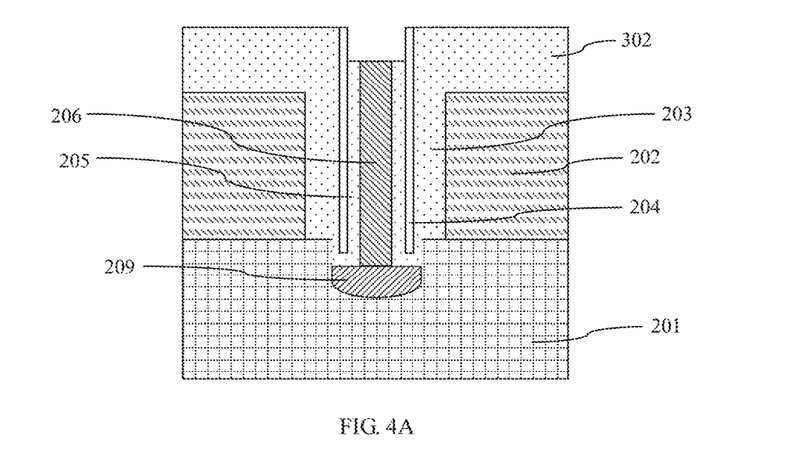
FIG. 4A to FIG. 4B illustrate schematic diagrams of structures of devices in each step of a method for manufacturing a semiconductor device according to a preferred embodiment of the present application.

After step 3, the method further includes the following steps:

Referring to FIG. 4A, a source region 209 is formed in the semiconductor substrate 201 at the bottom of the first groove 303a.

A floating gate 204 and a source line 206 are formed in the source contact opening.

In a transverse direction, the floating gate 204 is located between the first gate structure 202 and the source line 206.

The floating gate 204 and a side surface of the source region side of the first gate structure 202 are isolated by a first inter-gate dielectric layer 203. The first inter-gate dielectric layer 203 includes the first dielectric layer 302.

The floating gate 204 and the source line 206 are isolated by a second inter-gate dielectric layer.

A bottom of the source line 206 is in direct contact with the source region 209.

A bottom section of the floating gate is located in the first groove 303a, and the bottom surface of the floating gate 204 and the semiconductor substrate 201 are isolated by a floating gate dielectric layer; during writing, the source line 206 is simultaneously used as a control gate, and under the control of the control gate, electrons in the channel region are implanted into the bottom section of the floating gate 204 under the effect of a transverse electric field.

A top surface of the floating gate 204 is higher than a top surface of the source line 206.

The floating gate 204 consists of a TiN layer.

Figure 4B:
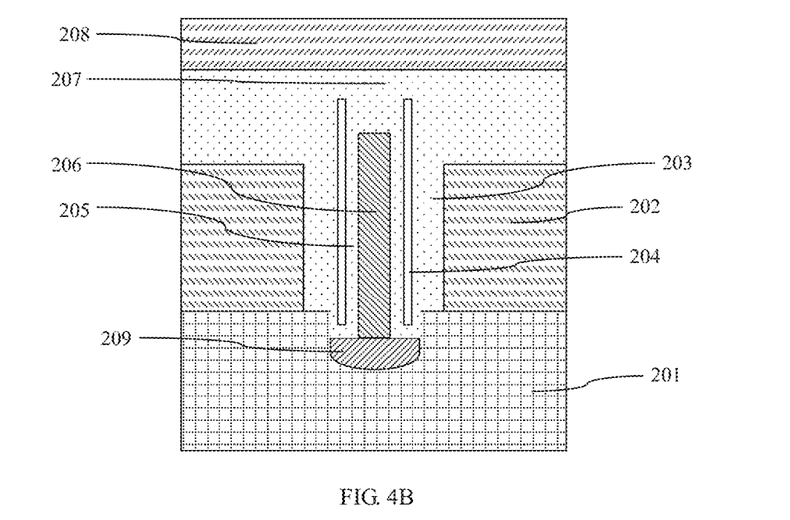

The method further includes the following steps:

Referring to FIG. 4B, an erase gate 208 is formed.

The erase gate 204 covers tops of the floating gate 208 and the source line 206, and the erase gate 208 and the floating gate 204 and the source line 206 at the bottom are isolated by a third inter-gate dielectric layer 207.

FIG. 4B does not illustrate the structure of the drain region end of the flash memory cell. The drain region of the flash memory cell is formed in the drain region side of the first gate structure. Since the drain region process will not affect the process of the source region side, it will not be described in detail here.

In the manufacturing process of the super flash memory, the semiconductor substrate 201 is often etched in the existing source contact etching process of the super flash memory, so the technical effect of increasing the stress in the channel region can be achieved by adding the SMT process after the source contact etching process is completed. Therefore, the preferred embodiment of the present application can be implemented by only specially setting the time of the SMT process. Compared with the existing method in which the SMT process is performed after the formation of the gate structure, the SMT process is performed after the source contact etching process in the preferred embodiment of the present application. Therefore, the preferred embodiment of the present application can significantly increase the stress in the channel region of the flash memory cell of the super flash memory without adding additional process and time cost, thus improving the reading-writing performance of the flash memory cell.

The present application has been described in detail through specific embodiments, which, however, do not constitute limitations to the present application. Without departing from the principle of the present application, those skilled in the art can also make many modifications and improvements, which should also be considered as include in the scope of protection of the present application.

What is claimed is:

1. A method for manufacturing a semiconductor device super flash memory, comprising steps of:

step 1: providing a semiconductor substrate, forming first gate structures on the semiconductor substrate, and forming a channel region in the semiconductor substrate covered by the first gate structures;

step 2: performing a first etching process to etch the semiconductor substrate on at least one side of each first gate structure to a certain depth and form a first groove, wherein a bottom surface of each first gate structure, a top surface of the semiconductor substrate, a top surface of the channel region, and a top surface of the first groove are flat, a bottom surface of the first groove is located below the top surface of the semiconductor substrate, and a bottom surface of the channel region is located below the top surface of the semiconductor substrate; and step 3: performing a stress memorization process, comprising the following sub-steps:

step 31: forming a stress dielectric layer, the stress dielectric layer covering a peripheral surface of each first gate structure and being filled in the first groove;

step 32: performing annealing to transfer a stress of the stress dielectric layer to the channel region, the stress in the channel region after stress transfer being increased in the process of stress transfer by using a characteristic that the stress dielectric layer located in the first groove laterally acts on the channel region; and step 33: removing the stress dielectric layer, wherein, in step 1, each first gate structure is a word line gate of a flash memory cell of the super flash memory; and in step 2, the first groove is located in a source region side of the first gate structure, the first etching process is an over-etching process of a source contact etching process, the source contact etching process firstly etches a first dielectric layer between adjacent first gate structures to form a source contact opening and then over-etches the semiconductor substrate at a bottom of the source contact opening to form the first groove, and the first groove is used as a part of the source contact opening, wherein, after step 3, the method for manufacturing the super flash memory further comprises the following steps:

forming a source region in the semiconductor substrate at a bottom of the first groove; and forming a floating gate and a source line in the source contact opening, wherein in a transverse direction, the floating gate is located between the first gate structure and the source line;

the floating gate and a side surface of the source region side of the first gate structure are isolated by a first inter-gate dielectric layer, and the first inter-gate dielectric layer comprises the first dielectric layer;

the floating gate and the source line are isolated by a second inter-gate dielectric layer;

a bottom of the source line is in direct contact with the source region;

a bottom section of the floating gate is located in the first groove, and the bottom surface of the floating gate and the semiconductor substrate are isolated by a floating gate dielectric layer; during writing, the source line is simultaneously used as a control gate, and under the control of the control gate, electrons in the channel region are implanted into the bottom section of the floating gate under an effect of a transverse electric field; and a top surface of the floating gate is higher than a top surface of the source line.

2. The method for manufacturing the super flash memory according to claim 1, wherein the semiconductor substrate comprises a silicon substrate.

3. The method for manufacturing the super flash memory according to claim 1, wherein each first gate structure comprises a first gate dielectric layer and a first polysilicon gate superposed sequentially.

4. The method for manufacturing the super flash memory according to claim 1, wherein, in step 2, two sides of each first gate structure are respectively a source region side and a drain region side; the first groove is located in the source region side of the first gate structure; or the first groove is located in the source region side and the drain region side of the first gate structure.

5. The method for manufacturing the super flash memory according to claim 1, wherein a depth of the first groove is 200Å.

6. The method for manufacturing the super flash memory according to claim 1, wherein the method for manufacturing the super flash memory further comprises:

forming an erase gate, wherein the erase gate covers tops of the floating gate and the source line, and the erase gate, and the floating gate and the source line at the bottom are isolated by a third inter-gate dielectric layer.

7. The method for manufacturing the super flash memory according to claim 1, wherein the floating gate consists of a TiN layer.

8. The method for manufacturing the super flash memory according to claim 1, wherein the annealing in step 32 is rapid thermal annealing.

9. The method for manufacturing the super flash memory according to claim 1, wherein, in step 31, the stress dielectric layer has tensile stress, the super flash memory is an N-type device, and the channel region is a P-type doped region.

10. The method for manufacturing the super flash memory according to claim 9, wherein the stress dielectric layer is a first silicon nitride layer with tensile stress.

11. The method for manufacturing the super flash memory according to claim 10, wherein, before forming the stress dielectric layer, the method for manufacturing the super flash memory further comprises a step of forming a stress blocking layer, and in the first groove, the stress blocking layer is located between the stress dielectric layer and the semiconductor substrate to prevent stress damage caused by the stress dielectric layer to the semiconductor substrate.

12. The method for manufacturing the super flash memory according to claim 11, wherein a material of the stress blocking layer comprises silicon dioxide.

* * * * *